(12) United States Patent
Cima

(10) Patent No.: US 10,677,821 B2
(45) Date of Patent: Jun. 9, 2020

(54) ISOLATED DC CURRENT AND VOLTAGE SENSOR WITH LOW CROSSTALK

(71) Applicant: NEELOGY, Saint Avertin (FR)

(72) Inventor: Lionel Fabien Cima, Saint-Cyr-sur-Loire (FR)

(73) Assignee: NEELOGY, Saint-Avertin (FR)

(*) Notice: Subject to any disclaimer, the term of this patent is extended or adjusted under 35 U.S.C. 154(b) by 0 days.

(21) Appl. No.: 15/561,783

(22) PCT Filed: Mar. 30, 2016

(86) PCT No.: PCT/EP2016/056949
§ 371 (c)(1),
(2) Date: Sep. 26, 2017

(87) PCT Pub. No.: WO2016/156422
PCT Pub. Date: Oct. 6, 2016

(65) Prior Publication Data
US 2018/0080961 A1 Mar. 22, 2018

(30) Foreign Application Priority Data
Mar. 30, 2015 (FR) ..................... 15 52694

(51) Int. Cl.
*G01R 33/02* (2006.01)
*G01R 19/145* (2006.01)
(Continued)

(52) U.S. Cl.
CPC ........... *G01R 19/145* (2013.01); *G01R 15/20* (2013.01); *G01R 33/022* (2013.01);
(Continued)

(58) Field of Classification Search
CPC .... G01R 33/022; G01R 33/035; G01R 33/04; G01R 33/0206; G01R 19/145; G01R 15/20; G01R 15/18; G01R 15/202; G01R 15/207
See application file for complete search history.

(56) References Cited

U.S. PATENT DOCUMENTS 4,596,950 A * 6/1986 Lienhard ................ G01R 17/06
324/117 R
5,717,326 A * 2/1998 Moriwaki .............. G01R 15/18
324/117 H
(Continued)

FOREIGN PATENT DOCUMENTS

| FR | 1158584 A | 6/1958 |
|---|---|---|
| FR | 1162100 A | 9/1958 |
| FR | 1453276 A | 6/1966 |
| FR | 2971852 A1 | 8/2012 |

OTHER PUBLICATIONS

French Search Report from French Patent Application No. 1552694, dated Jan. 26, 2016.
(Continued)

*Primary Examiner* — Minh N Tang
(74) *Attorney, Agent, or Firm* — Greer, Burns & Crain, Ltd.

(57) ABSTRACT

A device for magnetic measurement that includes a DC magnetic field sensor having at least four discrete elements, each of the discrete elements being constituted by at least one coil and a magnetic material without remanence, where the at least four discrete elements are substantially identical. The magnetic field sensor includes a first discrete element orientated in a given direction, and a second discrete element associated therewith to constitute a first differential pair. The second discrete element being orientated in parallel but in an opposite direction relative to the first discrete element. The device further including two other discrete elements consti-
(Continued)

tuting a second differential pair substantially identical to the first differential pair. The two other discrete elements being parallel to the orientation of the first differential pair but are respectively orientated in an opposite direction to the first and second discrete elements of the first differential pair.

12 Claims, 2 Drawing Sheets

(51) Int. Cl.
  *G01R 33/04*   (2006.01)
  *G01R 15/20*   (2006.01)
  *G01R 33/022*   (2006.01)
  *G01R 33/035*   (2006.01)

(52) U.S. Cl.
  CPC ....... *G01R 33/0206* (2013.01); *G01R 33/035* (2013.01); *G01R 33/04* (2013.01)

(56) References Cited

U.S. PATENT DOCUMENTS

| | | | |
|---|---|---|---|
| 8,803,520 B2* | 8/2014 | Lenglet | G01R 33/04 324/117 R |
| 2002/0180417 A1* | 12/2002 | Colby | G01R 15/18 324/117 R |
| 2008/0252289 A1 | 10/2008 | Lenglet | |
| 2009/0021249 A1 | 1/2009 | Kumar et al. | |
| 2011/0140694 A1 | 6/2011 | Cima et al. | |

OTHER PUBLICATIONS

International Search Report from International Patent Application No. PCT/EP2016/056949, dated May 20, 2016.
Vourc'h et al., "Novel Magnetic Field and Current Sensors Based on Superparamagnetic Transducers", Sensor Letters (2009), 7(3), pp. 293-298.

* cited by examiner

ISOLATED DC CURRENT AND VOLTAGE SENSOR WITH LOW CROSSTALK

BACKGROUND

The present invention relates to a device for measuring magnetic field and more particularly for measuring direct current of a primary conductor. The field of the invention is that of measuring magnetic fields (magnetometers) or measuring electric currents via their magnetic fields (contactless current transducer).

In the field of DC current sensors "shunts" are known, which have a high immunity to disturbing currents and allow the accurate measurement of currents, but they are not naturally isolated. The use of a shunt requires an electronic isolation which is generally expensive and bulky, not very robust under environmental stress (in particular high temperature). For high voltage applications (>50V), optical isolation solutions exist. Generally, the material used for the measurement is a material the resistivity of which has a substantially zero thermal drift constant (constantan for example). Sometimes copper is used directly; then a compensation for the thermal drifts must be provided, which complicates the measurement and generally makes it less accurate. Among the defects of the shunt, the dissipation of power by Joule effect can be noted. For a 1000 A sensor there is typically a resistance of 10 µOhm and therefore 10 W of heat dissipation. One of the consequences is the great difficulty of using a shunt in a compact system due to its self-heating.

Generally a shunt is also quite bulky so as to allow for exactly this temperature dissipation without exceeding the maximum temperature of the latter.

The open-loop Hall Effect sensors are not very accurate and are very sensitive to disturbing currents. In order to improve their immunity, magnetic shieldings are often used which introduce additional defects: they are subjected to strong magnetic remanences which decay over time and with temperature.

The zero-flux Hall effect sensors are very accurate and are based on the use of a magnetic core which acts as magnetic shielding and field channel. They are however also subject to decay of magnetic remanence over time and with temperature. They are also large and have a large space requirement due the presence of the core of magnetic material necessary for channelling the magnetic flux and for shielding.

Flux Gate technology is very sensitive and accurate but is extremely sensitive to crosstalk and to disturbed environments due to the high permeability of its magnetic material. The technology then requires heavy and bulky shielding solutions in order to prevent local saturation of the transducer core under the effect of a magnetic field.

The GMR (Giant MagnetoResistance) and/or AMR (Anisotropic MagnetoResistance) technologies are relatively sensitive and accurate when they use the zero flux principle. They are easily incorporated into an integrated circuit, except for the compensation coil which poses a problem for strong fields. As a result, they are relatively sensitive to crosstalk phenomena and they also show a magnetic offset drift due to the ferromagnetic nature of their transducer.

Fibre optic current sensors (FOCS) are based on the Faraday effect. They are very effective for measuring very high currents (up to 600 kA). They have an excellent immunity to crosstalk, and excellent performance during zero-flux operation. This introduces a high power consumption for high currents. However, a priori, FOCS cannot be utilized where integration is required, as they are relatively bulky and need to surround the primary conductor.

Current sensors of the transformer type (air-core Rogowski or magnetic-core current transformer (CT)) have a relatively low sensitivity to crosstalk, but do not allow DC components to be measured.

Moreover, for most of the technologies used, sudden variations in the primary voltage (dV/dt) cause injections of stray currents affecting the electronics of the sensor (at best saturation of the measurement stages, at worst destruction), that can be prohibitive. This is particularly noticeable in the case of the shunt. Certain technologies such as the transformer (CT, Rogowski or Hall or Flux Gate) allow the use of an electrostatic screen, as the measurement of the magnetic field is carried out in a core outside the primary conductor.

The Néel® Effect is very accurate. The technology described in patent No. FR 2891917 is called the Néel® Effect and is based on the use of a coil and a zero-remanence magnetic composite B(H) of which the third derivative at the origin presents an extremum (for example a superparamagnetic composite). The Néel® Effect technology is not very sensitive to external fields due to the low permeability of their magnetic material. They exist in a flexible "universal" form of Rogowski type for measuring direct currents (patent FR 2931945). This topology has a high immunity to crosstalk, taking Ampere's theorem as a basis and measuring the circulation of the magnetic field over a substantially closed external contour. This topology has the same advantages and drawbacks as the other technologies from the point of view of incorporation: they are large as they must surround the primary conductor and they have a high electricity consumption in order to operate at zero flux.

Compact topologies for Néel® Effect sensors have also been to described, based on a measurement directly on a busbar or even inside a busbar, in order to allow a significant reduction in consumption despite zero-flux operation (French patent applications No. 1158584 and No. 1162100). It is however difficult with these topologies to be able to ensure good voltage stability, and also to add an electrostatic screen and to have a high immunity to crosstalk.

SUMMARY

A subject of the present invention is:

A novel sensor that is very compact; to this end the volume and the weight of the sensor must be reduced to the maximum. The problem with magnetic sensors is that they are sensitive to the crosstalk fields generated by external conductors. In order to overcome this, either Ampere's theorem, which consists of completely surrounding the primary conductor, is used, or a shielding which allows the external fields to be reduced at the level of the sensitive elements. If for the sake of compactness it is undesirable to use Ampere's theorem, and removal of the shielding is desired, then it should be noted that the intrinsic immunity of the element which is sensitive to external fields must be improved. This eliminates the conventional structures of the Hall effect, fluxGate, flexible Néel® Effect and GMR/AMR type.

A novel sensor capable of ensuring accurate measurement despite an environment subject to stresses and in particular, for the requirements of incorporation, in the presence of high thermal stresses (large range of ambient temperature and low thermal resistivity). For magnetic sensors, a zero-flux compensation system must necessarily be used in order to overcome the thermal drifts of the transducer material. From the point of view of heat dissipation, and in order not to heat the environment too much, consumption must be reduced (at the level of the primary conductor and the transduction elements). This eliminates the conventional structures of the Hall effect, FluxGate, Magneto-Optic type.

A novel sensor capable of withstanding the stresses of primary, static and dynamic voltages. It must ensure voltage isolation, typically for up to 20 kV for low voltage LV applications, for which a sufficient distance must be provided between the sensitive element and the primary conductor. In order to reduce the stray currents injected into the electronics by the variations in primary voltages dV/dt, an electrostatic screen must be used.

A novel sensor capable of optionally allowing a DC and AC measurement at high frequency and with large variations in currents dI/dt. The conductors undergo the high frequency skin effect which deforms power lines and makes AC measurement difficult unless a conventional current transformer CT is used. The aim of the novel sensor is to take this skin effect into consideration. The high di/dt require that dynamic effects are taken into consideration.

A novel sensor capable of allowing a retrofit measurement on a busbar. One solution would be to "bond" a sensor onto a busbar in order to bypass a controlled fraction of current. The level of intense field generated by the busbar itself must then be taken into consideration.

At least one of the objectives is achieved with a magnetic measurement device comprising a direct current (DC) magnetic field sensor constituted by at least four discrete elongate elements (great length with respect to the diameter or small side of the section, for example a ratio greater than 2, 3, 5 or 10), each element being constituted by at least one coil and by a magnetic material without remanence, these discrete elements being substantially identical. According to the invention, the magnetic field sensor comprises:
  a first discrete element orientated in a given direction, a second element is associated therewith in order to constitute a first differential pair orientated in a substantially identical direction but opposite way, and
  two other elements constituting a second differential pair substantially identical to the first, but once more again orientated in a substantially identical direction to the direction of the first pair but respectively opposite way.

With the present invention, a magnetic field sensor is produced comprising two pairs of transducer elements arranged following the lines of magnetic fields in order to carry out the measurement and so as to be immunized to the maximum against any disturbance due to external conductors. In practice and advantageously, the device according to the invention can be used as transducer connected to, and controlled by, a processing unit. Different types of connections and different types of measurement methods can be envisaged. Non-limitatively, the device according to the invention can be used as transducer for the application such as described in French patent application No. 1453276.

According to an advantageous characteristic of the invention for measuring direct current or direct voltage, the device according to the invention moreover comprises a conversion component capable of converting a measurand, a variable to be measured, to a magnetic field the projection of which along a path constituted by the four discrete elements is non-zero. For measuring current in particular, the conversion component can be constituted by a conductor composed of at least one element of two bars forming a U. This conductor is placed in series in the electrical circuit in which it is desired to measure a current.

For measurement of the voltage on a primary conductor, the conversion component can be constituted by at least one multi-turn coil connected to the primary conductor in parallel via a high impedance resistor, typically greater than 100 kOhms.

In particular in addition to the above, the discrete elements can be Néel® Effect transducers each constituted by at least one coil and a superparamagnetic core.

According to the invention, in order to homogenize the magnetic field in the measurement elements, the component converting the current to a magnetic field can be constituted by at least two conductive elements placed above and below the measurement cell.

The component converting the current to a magnetic field described above can be constituted by two substantially identical additional bars generating a substantially zero field at the level of the discrete measurement elements. The benefit of these two bars is to bypass a high proportion of the primary current (>30%, >50%, >75%, >90%) without the latter generating a magnetic field in the discrete measurement elements. Thus, this makes it possible to increase the current measurement range with the same dimensioning of the discrete field measurement elements.

Advantageously, the component converting the current to a magnetic field can be constituted by several layers of conductors that are isolated from each other. This makes it possible to overcome the high-frequency skin effect.

The component converting the current to a magnetic field can also be placed in bypass position on the primary conductor (for example directly on a busbar). In this configuration, an orientation of the discrete to measurement elements will preferentially be chosen so that the main primary conductor generates a magnetic field component perpendicular to the discrete measurement elements. The main primary is specified here because, since the current is in bypass, the sensor itself forms part of the primary conductor, the main primary conductor being the one that does not directly contribute to the magnetic field to be measured.

In this in bypass configuration, care will preferably be taken for the component converting the current to a magnetic field and the main primary conductor to be constituted by substantially identical conductive materials.

According to another aspect of the invention, a method is provided for measuring high current consisting of placing a measurement device as described above as in bypass of a primary conductor, in order to capture a fraction of primary current.

Moreover, the discrete elements can be substantially placed in one and the same plane. This makes it possible to facilitate the use of an electrostatic screen which surrounds the measurement cell assembly.

By way of non-limitative example, the size of a discrete element (the coil with its core) can be of the order of 10 mm long and 3 mm in diameter. Generally, the length can be >1 mm or >3 mm or >10 mm (a balance must be struck between the compactness and the length, the longer it is, the better the performance). The diameter can be >500 µm or >1 mm or >2 mm (a balance must be struck between the compactness and the diameter, the larger the diameter, the better the performance). There is no upper limit, as applications exist where performance prevails over compactness. Moreover, the discrete elements are very close to one another, or even in contact. The further apart they are, the poorer the performance.

BRIEF DESCRIPTION OF THE DRAWINGS

Other advantages and characteristics will become apparent on examination of the detailed description of an embodiment which is in no way limitative, and the attached drawings, in which.

DETAILED DESCRIPTION

Figure 1:
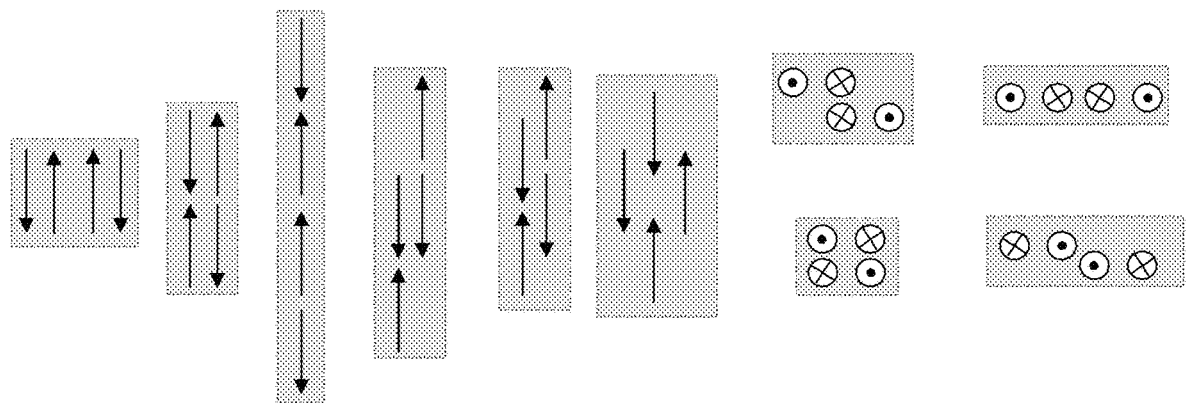
FIG. 1 shows several examples of dual differential topologies according to the invention.

In FIG. 1 several examples of dual differential topologies for the production of a magnetic field sensor are shown. A compact sensor is obtained by using a measurement cell based on the use of elongate "discrete" elements allowing the local measurement of an orientated magnetic field while still seeking to optimize immunity to crosstalk due to external conductors. For this purpose at least four discrete elongate elements are used, substantially identical and distributed in space according to a dual differential topology as shown in FIG. 1. Starting from a first discrete element orientated in a given direction, the second element which is associated with it in order to constitute a first differential pair orientated in a substantially identical direction but opposite way. Thus this first pair will be insensitive to uniform external fields whatever their directions. It should be noted that this differential pair will only be sensitive to the gradients of the external fields in a favoured direction. The second differential pair will be substantially identical to the first but once more orientated in a direction substantially identical, but opposite way, to the first pair. Thus this measurement cell will be insensitive to the uniform fields but also to the uniform gradients of an external field. A sensitivity to the gradient of the field gradient will remain and in this regard it is preferable to seek to bring the elements together to the maximum extent in order to reduce this residual sensitivity.

In order to allow the measurement of a variable other than a magnetic field, this measurement cell is associated with a component allowing the conversion of the measurand to a magnetic field, called primary magnetic field Hp, the projection of which along the path constituted by the 4 discrete elements is non-zero. Preferentially in order to improve the linearity, the primary field will be substantially uniform at the level of each of the four discrete elements.

Figure 2:
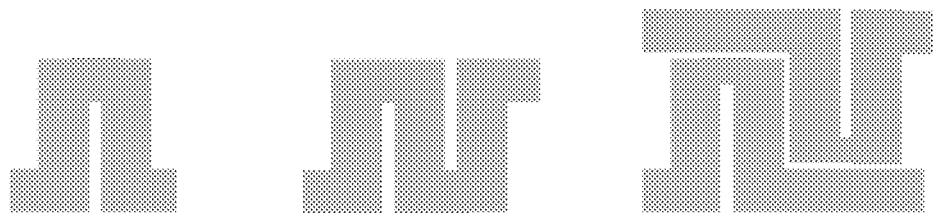
FIG. 2 shows several examples of forms of primary conductors for generating the field to be measured.

For a current sensor, this involves for example an electrical conductor through which a current passes that is an image of the primary current, a component called IpHp. Preferentially this conductor IpHp is constituted by bar elements forming at least one U as shown for example in FIG. 2.

Figure 7:
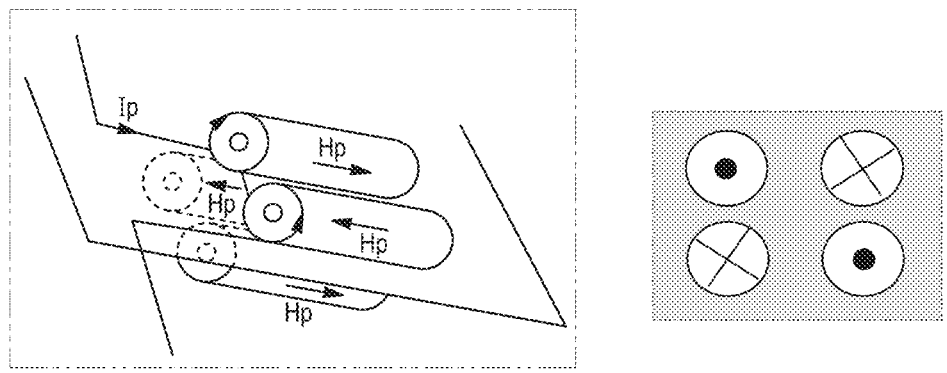
FIG. 7 shows an example of a wound current transducer for measuring small currents and/or voltages, to the left, the IpHp converter with the 4 coils arranged for example on a PCB support as well as the direction of the primary fields; to the right the orientation of the 4 discrete measurement elements in side view.

For a voltage sensor or for a sensor of low intensity-current, this involves for example a conductor through which a current passes that is an image of the primary voltage and the component will be called UpHp. Preferentially this conductor UpHp is a multi-turn coil connected either in parallel with a primary voltage via a resistor of very high impedance, or directly in series with a low-intensity current. An embodiment example is shown in FIG. 7.

It is possible to imagine that the sensitive elements are Hall effect transducers, or Flux Gate, AMR/GMR, or Néel® Effect type transducers. The demerit of the FluxGate or AMR/GMR transducers is that they are very sensitive to external fields perpendicular to the direction of measurement. Thus the benefit of the dual differential form will be nullified by the non-linear effects introduced by the external fields.

Preferentially, the discrete elements will be Néel® Effect transducers each constituted by at least one coil and a superparamagnetic core.

The device according to the invention makes it possible to ensure accurate measurement despite a stressed environment and in particular in the presence of low thermal resistivity. It is important to operate at zero flux with a field feedback type system, in order to eliminate the effects of the drifts of the transducer materials (Hall or Néel® Effect). Therefore a field compensation coil must be used and in this respect a discrete element of the coil type with Néel Effect is preferentially used.

Figure 3:
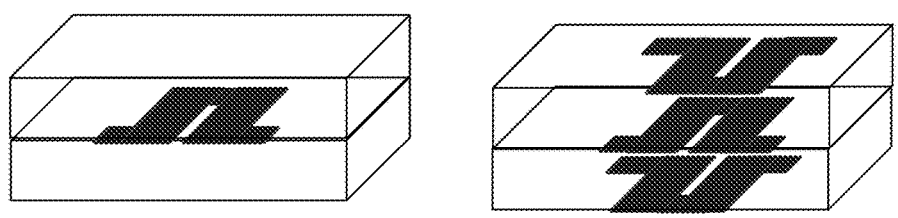
FIG. 3 shows several examples of measurement in two planes with to the right a structure with several stages for the uniformization of the to primary field.
Figure 4:
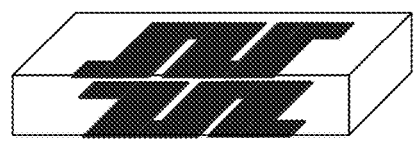
FIG. 4 shows a measurement example with several stages for the uniformization of the primary field with a measurement in a single plane.

In order to improve the performance of the sensor in terms of linearity, in the case of current sensors a solution is used making it possible to uniformize to the maximum the primary field and to orientate to the maximum in the direction of the measurement coils. Then preferentially a conversion component IpHp will be used, constituted by at least two conductive elements placed above and below the measurement cell as shown in FIGS. 3 and 4.

Figure 5:
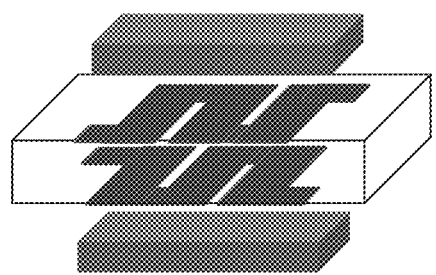
FIG. 5 shows an example of a transducer with a conversion component IpHp constituted by two parts situated above and below the measurement cell and two busbars.

In order to reduce the heat dissipation in the sensor, the conversion component of the primary current to primary field may be connected in bypass of the primary conductor. Thus, only a fraction of current will be bypassed, thus making it possible to reduce the power necessary for the feedback in order to operate at zero flux. Preferentially this bypass will be placed between two substantially identical busbars so that the magnetic field generated at the level of the measurement cells by the current which is not bypassed in the conversion component IpHp is minimal, or even zero. An embodiment example is described in FIG. 5. As regards cost, a busbar with simple grooves can then be used to constitute the conversion component IpHp.

In order to ensure that the ratio between the bypassed current and the total primary current is indeed independent of the temperature, an identical conductive material will preferentially be chosen for all the parts of the conversion component IpHp. This is one of the reasons why one cannot usefully carry out this measurement in bypass with shunt technology.

The device according to the invention makes it possible to withstand the stresses of primary voltages. Preferentially, a measurement cell is used, following a topology making it possible to place the discrete elements in one and the same compact volume. Thus, it will be possible in a restricted space to ensure an isolation distance (minimum distance between the conversion elements and the primary conductor or conductors) that is as large as possible. Similarly, it will be easier to place the measurement elements in a Faraday cage connected to a fixed potential. Thus preferentially, the measurement cell will be surrounded by a conductive electrostatic screen. It is possible to produce the assembly of the discrete elements by using a technology of the PCB (Printed Circuit Board) type, which has the advantage of allowing a high degree of control over the symmetry of the four coil elements. The magnetic circuit can be fitted into the PCB according to a known embedded component technique, or directly by filling the isolating composite (for example epoxy) with magnetic particles (for example with superparamagnetic nanoparticles). Similarly, the electrostatic screen can be constituted by copper layers on both sides of the PCB, closed at the ends by specific metallizations.

The device according to the invention allows a DC and AC measurement at high frequency and despite large variations in current dI/dt. In order to allow DC and AC measurement at high frequency, the conversion component IpHp must not be very sensitive to the frequency. For this purpose, care is taken to use a thickness for the conversion components IpHp which is substantially less than the skin thickness calculated at the maximum frequency of use. If for thermal reasons for example and/or space requirement it is not possible to respect this constraint, then the conversion components IpHp will preferentially be constituted by several layers of conductors that are isolated from each other. It will then be possible to measure both the DC and AC components at the level of the measurement cell.

The device according to the invention allows a measurement in bypass on a busbar. In order to carry out a retrofit measurement of the current circulating in a conductor of busbar type, the sensor described above can be used and simply "fixed" on said busbar in order to bypass a fraction of its primary current. The magnetic field at the level of the discrete measurement elements will then be composed of the primary field to be measured, offset from the field originating from the busbar. In order to limit to the maximum the nonlinearities that the busbar could introduce, preferentially a choice will be made to orientate the discrete elements in a direction substantially perpendicular to that of the primary field generated by the busbar where there is no bypass. Thus, only the bypass current will generate a field in the axis of orientation of the discrete elements.

Figure 6:
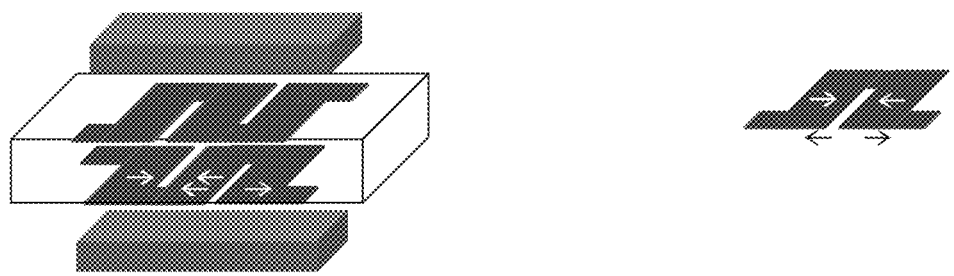
FIG. 6 shows a example of a transducer for measuring current.

FIG. 6 shows an example of a transducer for measuring current. In the figure on the left, a device is shown which can be identical to that of FIG. 5, the figure on the right illustrating more specifically a busbar in the shape of a U.

Of course, the invention is not limited to the examples which have just been described and numerous adjustments can be made to these examples without exceeding the scope of the invention.

The invention claimed is:

1. A device for magnetic measurement comprising:
   a DC magnetic field sensor constituted by at least four discrete elements, each of said discrete elements being constituted by at least one coil and a magnetic material without remanence, the at least four discrete elements being substantially identical, wherein the magnetic field sensor comprises:
   a first discrete element orientated in a given direction, and a second discrete element associated therewith to constitute a first differential pair, the second discrete element is orientated in parallel but in an opposite direction relative to the first discrete element;
   two other discrete elements constituting a second differential pair substantially identical to the first differential pair, but the two other discrete elements being parallel to the orientation of the first differential pair but the two other discrete elements of the second differential pair being respectively orientated in an opposite direction to the first and second discrete elements of the first differential pair; and
   a conversion component configured for converting a quantity to be measured to a magnetic field, wherein the magnetic field has a projection along a path constituted by the first discrete element, the second discrete element and the two other discrete elements, wherein said projection is non-zero.

2. The device according to claim 1, wherein the conversion component is constituted by a conductor composed of at least one element of two bars forming a U shape.

3. The device according to claim 2, wherein the conversion component is constituted by at least two conductive elements placed above and below a measurement cell.

4. The device according to claim 2, wherein the conversion component is constituted by two substantially identical additional bars generating a substantially zero field at a level of the discrete elements.

5. The device according to claim 2, wherein the conversion component is constituted by several layers of conductors that are isolated from each other.

6. The device according to claim 2, wherein the conversion component is placed in bypass on a primary conductor so that the primary conductor generates a magnetic field component perpendicular to the discrete elements.

7. The device according to claim 6, wherein the conversion component and the primary conductor are constituted by substantially identical conductive materials.

8. The device according to claim 1, wherein the conversion component is constituted by at least one multi-turn coil connected in parallel to a primary conductor via a resistor with a high impedance.

9. The device according to claim 1, wherein the discrete elements are transducers each constituted by at least one coil and a superparamagnetic core.

10. The device according to claim 1, wherein the discrete elements are substantially placed in the same plane.

11. A method for measuring high current consisting of placing the device of claim 1, in bypass of a primary conductor to capture a fraction of primary current.

12. The device according to claim 1, wherein the conversion component is constituted by a conductor composed by two elements, each of said two elements having two bars forming a U shape.

* * * * *